(12) United States Patent
Ogawa et al.

(10) Patent No.: US 7,334,324 B2
(45) Date of Patent: Feb. 26, 2008

(54) METHOD OF MANUFACTURING MULTILAYER WIRING BOARD

(75) Inventors: Minoru Ogawa, Gifu (JP); Masahiro Izumi, Gifu (JP); Shigeyasu Itoh, Gifu (JP); Shingetsu Yamada, Nagahama (JP); Shuuji Suzuki, Nagahama (JP); Hiroo Kurosaki, Nagahama (JP)

(73) Assignees: Sony Corporation, Tokyo (JP); Mitsubishi Plastics, Inc., Tokyo (JP)

( * ) Notice: Subject to any disclaimer, the term of this patent is extended or adjusted under 35 U.S.C. 154(b) by 206 days.

(21) Appl. No.: 10/925,644

(22) Filed: Aug. 24, 2004

(65) Prior Publication Data

US 2005/0025944 A1   Feb. 3, 2005

Related U.S. Application Data

(62) Division of application No. 10/357,183, filed on Feb. 3, 2003, now Pat. No. 6,797,367.

(30) Foreign Application Priority Data

Feb. 5, 2002   (JP)   ............................... 2002-028235

(51) Int. Cl.
   *H01K 3/22* (2006.01)
(52) U.S. Cl. ............................ 29/848; 29/825; 29/829; 29/846; 29/855; 29/856; 174/258; 174/265; 428/209; 428/320
(58) Field of Classification Search ................. 29/848, 29/825, 829, 846, 855, 856; 174/258, 265; 428/209, 320
   See application file for complete search history.

(56) References Cited

U.S. PATENT DOCUMENTS

| 5,325,583 | A | 7/1994 | Shimizu et al. ............... 29/849 |
| 5,773,882 | A | 6/1998 | Iwasaki ....................... 257/692 |
| 6,207,259 | B1 | 3/2001 | Iino et al. .................... 428/209 |
| 6,228,467 | B1 | 5/2001 | Taniguchi et al. .......... 428/209 |
| 6,359,235 | B1 | 3/2002 | Hayashi ...................... 174/260 |
| 6,591,491 | B2 * | 7/2003 | Fujii et al. ..................... 29/830 |

FOREIGN PATENT DOCUMENTS

| JP | H5-41572 | 2/1993 |
| JP | H5-275834 | 10/1993 |
| JP | H9-055569 | 2/1997 |
| JP | P2000-38464 | 2/2000 |
| JP | 2000-200976 | 7/2000 |
| JP | P200-200976 | 7/2000 |
| JP | 2000-277875 | 10/2000 |
| JP | P2001-119148 | 4/2001 |

(Continued)

*Primary Examiner*—A. Dexter Tugbang
*Assistant Examiner*—Tim Phan
(74) *Attorney, Agent, or Firm*—Woodcock Washburn LLP

(57) ABSTRACT

A method of manufacturing a, in order to accommodate the words range and to clarify the multilayer wiring board, grooves for forming a wiring circuit and via holes are formed in an insulating substrate formed from a thermoplastic resin composition comprising a polyarylketone resin with a crystalline melting peak temperature of at least 260° C. and an amorphous polyetherimide resin as the primary constituents, a metallic foil is embedded within the grooves so that the surface of the foil protrudes to the surface of the insulating substrate, and a conductive material formed by curing a conductive paste is used for filling the via holes.

3 Claims, 9 Drawing Sheets

FOREIGN PATENT DOCUMENTS

| | | |
|---|---|---|
| JP | P2001-196703 | 7/2001 |
| JP | P2001-230520 | 8/2001 |
| JP | P2001-244609 | 9/2001 |
| JP | P2001-257448 | 9/2001 |
| JP | P2002-248626 | 9/2002 |
| JP | P2002-260444 | 9/2002 |
| JP | P2002-261120 | 9/2002 |
| JP | P2002-261444 | 9/2002 |
| JP | P2002-270731 | 9/2002 |
| JP | P2002-290029 | 10/2002 |

* cited by examiner

METHOD OF MANUFACTURING MULTILAYER WIRING BOARD

CROSS-REFERENCE TO RELATED APPLICATIONS

This application is a divisional of U.S. patent application Ser. No. 10/357,183, filed Feb. 3, 2003 now U.S. Pat. No. 6,797,367, which is hereby incorporated by reference in its entirety.

BACKGROUND OF THE INVENTION

1. Field of the Invention

The present invention relates to a multilayer wiring board, a semiconductor device mounting board using such a wiring board, and a method of manufacturing such a multilayer wiring board.

2. Description of the Background Art

In recent years, the trend towards increased miniaturization and functionality of electronic equipment has produced a growing demand for higher density mounting of electronic components on the mounting boards used for mounting such electronic equipment. In order to enable these electronic components to be mounted on the mounting boards with higher densities, there are calls not only for further miniaturization of the electronic components, but also for finer and higher precision wiring processing on the printed wiring boards.

On the other hand, in order to ensure a minimal environmental impact, these days it is also necessary to consider the recycling of the aforementioned mounting boards. Consequently, wiring boards comprising a thermoplastic resin as a primary material have been attracting considerable attention.

These wiring boards use a highly heat resistant thermoplastic resin known as super engineering plastic, and not only enable finely detailed, high precision wiring processing, but also offer a number of other advantages including a high degree of mechanical strength, superior electrical insulation, and comparative ease of recycling. As a result, in order to meet the demands for increased wiring density, considerable research is being conducted into the use of highly heat resistant thermoplastic resins as the substrate materials for printed wiring boards.

Examples of thermoplastic resins which are used as these substrate materials include liquid crystal polymers and thermoplastic polyimides.

Furthermore, in a printed wiring board using one of these thermoplastic resins, a predetermined wiring circuit is formed on top of the printed wiring board in a similar manner to a conventional general purpose printed wiring board, namely using a so-called wet process in which copper foil is laminated on top of the printed wiring board, and the copper foil is then subjected to etching treatment using wet etching or the like to form the wiring pattern.

Other methods of forming the wiring circuit on the printed wiring board include methods in which the wiring circuit is formed by a dry process.

In these methods, screen printing techniques or dispensing techniques are used to print a conductive paste onto the printed wiring board in a predetermined wiring pattern, and this conductive paste is then subjected to heat treatment to complete the formation of a predetermined wiring circuit on the printed wiring board.

This method of printing on a conductive paste does not require the wet etching process used in conventional copper foil etching methods, and consequently the manufacturing process can be converted to a dry process, which offers the advantage of being even gentler on the environment.

The thermoplastic resin enables a shortening of the process tact, and also offers the advantages of superior moldability and plasticity, and is consequently considered a very favorable material as a board substrate material.

However, although conventional highly heat resistant thermoplastic resins offer advantages as highly heat resistant substrate materials, when the thermoplastic resin is laminated and integrated into a single unit, the resin must be heated to a temperature close to the resin melting point to ensure thermal fusion, and a problem arises during this heating and thermal fusion in that a resin flow, resulting from the large reduction in the modulus of elasticity at temperatures near the melting point, may cause distortions in the conducting material which forms the wiring circuit.

In addition, conventional printed wiring board production lines are suited to high volume low mix production, and consequently there is tendency for the production facilities to increase in size. Furthermore, chemical etching (wet etching) and plating techniques are typically used during the formation of wiring circuits on the printed wiring boards, and these techniques are undesirable from the viewpoint of environmental impact.

Furthermore as described above, examples of methods for wiring formation using dry processes include screen printing methods and dispensing methods using a conductive paste, although in both of these methods, there is a limit to the improvements in detail and precision of the conductive wiring which can be achieved in order to try and meet the ever increasing demands for higher density mounting.

In addition, as described above, in a laminated product of a thermoplastic resin on which a wiring circuit has been formed using a conductive paste, the resin must be heated to a temperature close to the melting point and subjected to pressure to fuse the thermoplastic resin layers together to create a single integrated unit, and as the pitch of the wiring becomes finer, distortion of the wiring resulting from resin flow during lamination is increasingly becoming a factor which cannot be ignored in substrate design.

BRIEF SUMMARY OF THE INVENTION

The present invention aims to resolve the problems described above, with an object of providing a multilayer wiring board with a high degree of heat resistance, which is capable of low temperature fusion without the occurrence of resin flow, enables high precision, finely detailed conductive wiring, can be ideally applied to low volume high mix manufacturing configurations, and also has little impact on the environment, as well as providing a semiconductor device mounting board using such a multilayer wiring board, and a method of manufacturing such a multilayer wiring board.

As a result of intensive research, the inventors of the present invention realized that if a substrate formed from a thermoplastic resin could be combined with a wiring pattern formed from a conductive paste to produce a wiring board, then a high performance, environmentally friendly multilayer wiring board could be produced, and were hence able to complete the present invention.

In other words, in a multilayer wiring board of the present invention, a wiring circuit is formed by embedding conductive wiring within an insulating substrate, formed from a thermoplastic resin composition comprising a polyarylketone resin with a crystalline melting peak temperature of at least 260° C. and an amorphous polyetherimide resin as the primary constituents, so that the surface of the wiring protrudes to the surface of the resin, and a plurality of wiring substrates, formed by smoothing the surface of an insulating substrate comprising embedded conductive wiring are laminated together, and wiring is provided which electrically connects the wiring substrates (1, 2, 3, 4) to one another, and the insulating substrates of these wiring substrates are bonded together by thermal fusion and crystallized, and the conductive wiring of the wiring circuit of each wiring substrate and the wiring used for electrically connecting each of the wiring substrates together, is formed from a conductive material produced by curing a conductive paste.

In this type of multilayer wiring board, the insulating substrate which forms an essential component of the wiring substrate utilizes a thermoplastic resin composition comprising a polyarylketone resin with a crystalline melting peak temperature of at least 260° C. and an amorphous polyetherimide resin as the primary constituents, and conductive wiring is embedded within the insulating substrate formed from this thermoplastic resin composition so that the surface of the wiring protrudes to the surface of the resin composition. By subsequently laminating a plurality of these wiring substrates and then bonding and crystallizing the wiring substrates through thermal fusion of the insulating substrates, a multilayer wiring board with excellent heat resistance, a high degree of mechanical strength and excellent electrical insulation can be achieved, and in addition, low temperature fusion is possible without the occurrence of resin flow, meaning the problem of wiring distortions resulting from such resin flow can be resolved, making high precision, finely detailed conductive wiring possible. As a result, a multilayer wiring board with excellent electrical characteristics and reliability can be provided.

Furthermore, by appropriate selection of both the thermoplastic resin composition, and the type and shape of the conductive wiring, a variety of different wiring substrates can be formed, and as a result, by combining wiring substrates with different specifications, the present invention can be applied to multilayer wiring boards with a wide variety of specifications.

In addition, the combination of a variety of wiring substrates of different specifications makes the invention ideally suited to low volume high mix type manufacturing configurations. Furthermore, by using a conductive paste for the electrical connections, wiring formation using wet processes becomes unnecessary, meaning the environmental impact can be reduced.

The aforementioned insulating substrate should preferably utilize an amorphous film produced by molten mixing and then rapid cooling of a thermoplastic resin composition comprising a polyarylketone resin with a crystalline melting peak temperature of at least 260° C. and an amorphous polyetherimide resin as the primary constituents.

Furthermore, the conductive wiring of the present invention preferably comprises a conductive material formed by curing a conductive paste and a metallic foil, with at least the surface of the metallic foil protruding to the surface of the substrate.

A semiconductor device mounting board of the present invention comprises a multilayer wiring board of the present invention with a semiconductor device mounted thereon.

According to a semiconductor device mounting board of the present invention, because the semiconductor device is mounted on a multilayer wiring board of the present invention, a high precision, finely detailed and high density semiconductor device mounting board can be produced with relative ease.

A method of manufacturing a multilayer wiring board according to the present invention comprises the steps of performing thermal molding on either one surface or both surfaces of an insulating substrate formed from a thermoplastic resin composition comprising a polyarylketone resin with a crystalline melting peak temperature of at least 260° C. and an amorphous polyetherimide resin as the primary constituents, at a temperature which is higher than the glass transition temperature of the thermoplastic resin composition but lower than the crystallization start temperature, thereby forming a conductive region comprising grooves, via holes, or a combination of grooves and via holes on the aforementioned one surface or both surfaces, subsequently filling the conductive region with a conductive paste and forming a wiring circuit in which the conductive paste functions as conductive wiring, thereby forming a wiring substrate comprising the insulating substrate and the wiring circuit, and subsequently laminating a plurality of these wiring substrates together, bonding and crystallizing the insulating substrates of these wiring substrates by thermal fusion at a temperature higher than the aforementioned crystallization start temperature, and electrically connecting the plurality of wiring substrates with conductive paste.

In this method of manufacturing a multilayer wiring board, a wiring substrate is generated by forming a wiring circuit comprising conductive wiring formed from a conductive paste on an insulating substrate formed from a thermoplastic resin composition comprising a polyarylketone resin with a crystalline melting peak temperature of at least 260° C. and an amorphous polyetherimide resin as the primary constituents, and a plurality of these wiring substrates are then laminated together, and the insulating substrates of these wiring substrates are then bonded together and crystallized by thermal fusion at a temperature higher than the aforementioned crystallization start temperature, while each of the wiring substrates are electrically connected together with conductive paste. Consequently, a multilayer wiring board with excellent heat resistance, a high degree of mechanical strength, excellent electrical insulation, and with high precision and finely detailed conductive wiring can be produced with relative ease. As a result, a multilayer wiring board with excellent electrical characteristics and reliability can be produced with relative ease.

Furthermore, by appropriate selection of the number of insulating substrates and the wiring circuits formed thereon, a variety of different wiring substrates can be formed, and by combining these wiring substrates, multilayer wiring boards with a wide variety of specifications can be produced with relative ease, meaning low volume high mix multilayer wiring boards can be prepared easily, and within a relatively short time period. Furthermore, in the manufacturing process, by employing a dry process in which electrical connection is achieved via a conductive paste, wiring formation processes relying on wet processes become unnecessary, meaning the environmental impact of the manufacturing process is lessened considerably.

In this method of manufacturing a multilayer wiring board, the insulating substrate should preferably utilize an amorphous film produced by molten mixing and then rapid cooling of a thermoplastic resin composition comprising a polyarylketone resin with a crystalline melting peak temperature of at least 260° C. and an amorphous polyetherimide resin as the primary constituents.

Another method of manufacturing a multilayer wiring board according to the present invention comprises the steps of positioning an impressing jig on one surface of an insulating substrate formed from a thermoplastic resin composition comprising a polyarylketone resin with a crystalline melting peak temperature of at least 260° C. and an amorphous polyetherimide resin as the primary constituents, with a metallic foil disposed therebetween, and positioning an elastic film, which displays a lower modulus of elasticity than the insulating substrate at temperatures lower than the glass transition temperature of the insulating substrate, on the other surface of the insulating substrate, subsequently using the impressing jig for performing thermal molding at a temperature which is higher than the glass transition temperature of the elastic film but lower than the crystallization start temperature of the insulating substrate, and subsequently peeling off the metallic foil, so that only those sections of the metallic foil in positions corresponding with convex sections of the impressing jig are fused to the insulating substrate.

According to this method of manufacturing a multilayer wiring board, an impressing jig is positioned on one surface of the insulating substrate formed from a thermoplastic resin composition comprising a polyarylketone resin with a crystalline melting peak temperature of at least 260° C. and an amorphous polyetherimide resin as the primary constituents, with a metallic foil disposed therebetween, and an elastic film, which displays a lower modulus of elasticity than the insulating substrate at temperatures lower than the glass transition temperature of the insulating substrate, is positioned on the other surface of the insulating substrate, and in this state, by carrying out thermal molding by pressing the impressing jig against the insulating substrate at a temperature which is higher than the glass transition temperature of the elastic film but lower than the crystallization start temperature of the insulating substrate, only those sections of the metallic foil in positions corresponding with convex sections of the impressing jig are fused firmly to the insulating substrate. Consequently, a multilayer wiring board with excellent heat resistance, a high degree of mechanical strength, excellent electrical insulation, and with high precision and finely detailed conductive wiring can be produced with relative ease. As a result, a multilayer wiring board with excellent electrical characteristics and reliability can be produced with relative ease.

Furthermore, by appropriate selection of the number of insulating substrates and the wiring circuits formed thereon, a variety of different insulating substrates and conductive wiring can be formed, and by combining these substrates and wiring, multilayer wiring boards with a wide variety of specifications can be produced with relative ease, meaning low volume high mix multilayer wiring boards can be prepared easily, and within a relatively short time period. Furthermore, in the manufacturing process, by employing a dry process in which electrical connection is achieved via a conductive paste, wiring formation processes relying on wet processes become unnecessary, meaning the environmental impact of the manufacturing process is lessened considerably.

DETAILED DESCRIPTION OF THE INVENTION

As follows is a description of embodiments of a multilayer wiring board of the present invention, a semiconductor device mounting board using such a multilayer wiring board, and a method of manufacturing a multilayer wiring board.

First Embodiment

Figure 1:
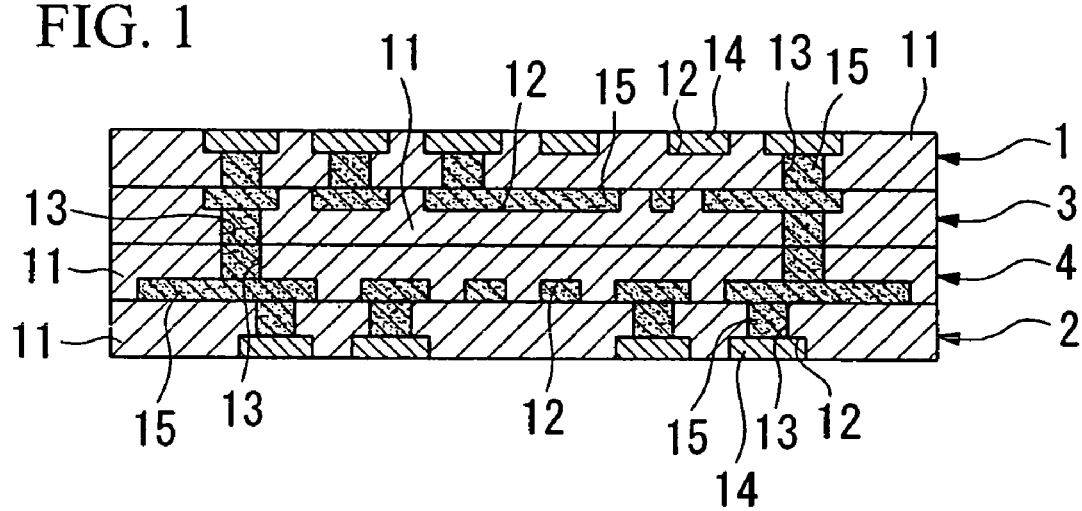
FIG. 1 is a cross-sectional diagram showing a multilayer wiring board of a first embodiment of the present invention.

FIG. 1 is a cross-sectional diagram showing a multilayer wiring board according to a first embodiment of the present invention. In the figure, symbol 1 represents an uppermost layer substrate (a wiring substrate of the uppermost layer), symbol 2 represents a lowest layer substrate (a wiring substrate of the lowest layer), and symbols 3 and 4 represent inner layer substrates (wiring substrates) sandwiched between the uppermost layer substrate 1 and the lowest layer substrate 4.

The uppermost layer substrate 1 is typically a film, a thin plate or a sheet of a thickness of no more than 100 μm, wherein grooves 12 for forming a wiring circuit are formed in one surface (the upper surface in the figure) of an insulating substrate 11 formed from a film, a thin plate or a sheet of a thermoplastic resin composition comprising a polyarylketone resin with a crystalline melting peak temperature of at least 260° C. and an amorphous polyetherimide resin as the primary constituents, via holes (through holes) 13 are formed which pass through the insulating substrate 11, a metallic foil 14 is embedded within the grooves 12 so that the surface of the foil protrudes to the surface of the insulating substrate, and a conductive material 15 formed by curing a conductive paste is used to fill the via holes 13. The upper and lower surfaces of the insulating substrate 11, including the metallic foil 14, have been smoothed and flattened.

The lowest layer substrate 2 is of exactly the same construction as the uppermost layer substrate 1, and differs only in the fact that the grooves 12 for forming the wiring circuit are formed in the lower surface of the insulating substrate 11.

The inner layer substrate 3 is typically a film, a thin plate or a sheet of a thickness of no more than 100 μm, wherein grooves 12 for forming a wiring circuit are formed in one surface (the upper surface in the figure) of an insulating substrate 111 formed from a film, a thin plate or a sheet of an identical thermoplastic resin composition to the uppermost layer substrate 1, via holes 13 which pass through the insulating substrate 11 are formed in a portion of the grooves 12, and a conductive material 15 formed by curing a conductive paste is used to fill the grooves 12 and the via holes 13. The upper and lower surfaces of the conductive paste 15, including the metallic foil 14, have been smoothed and flattened.

The inner layer substrate 4 is of exactly the same construction as the inner layer substrate 3 described above, and differs only in the fact that the grooves 12 for forming the wiring circuit are formed in the lower surface of the insulating substrate 11.

The lowest layer substrate 2, the inner layer substrates 4 and 3, and the uppermost layer substrate 1 are laminated together in that sequence, and then bonded together and integrated into a single unit by thermal fusion, and the wiring circuits of each of the substrates 1 to 4, and the wiring for establishing the electrical connections between each set of adjacent substrates 1 to 4 is formed from the conductive material 15 produced by curing a conductive paste.

The polyarylketone resin with a crystalline melting peak temperature of at least 260° C., which represents one of the primary constituents of the thermoplastic resin composition used for forming the insulating substrate 11, is a thermoplastic resin comprising an aromatic linkage, an ether linkage and a ketone linkage within the structural unit, and representative examples include polyetherketones, polyetheretherketones and polyetherketoneketones. Examples of commercially available polyetheretherketones include PEEK151G, PEEK381G, and PEEK450G (all of which are manufactured by Victrex Co., Ltd.)

The amorphous polyetherimide resin is an amorphous thermoplastic resin comprising an aromatic linkage, an ether linkage and an imide linkage within the structural unit, and there are no other particular restrictions on the structure. Examples of commercially available polyetherimides include Ultem CRS5001 and Ultem 1000 (both manufactured by General Electric Company).

The actual resin composition of the thermoplastic resin composition described above is preferably produced by mixing 20 to 50 parts by weight of an inorganic filler with 100 parts by weight of a thermoplastic resin composition formed from 70 to 25% by weight of the polyarylketone resin and 30 to 75% by weight of the amorphous polyetherimide resin.

The reason that the content of the polyarylketone resin is restricted to within a range from 70 to 25% by weight is because if the content exceeds 70% by weight, then the crystallinity becomes very high, making lamination more difficult when producing a multilayer structure, whereas if the content is less than 25% by weight, then the crystallinity of the overall composition falls, and the reflow heat resistance decreases even if the crystalline melting peak temperature is greater than 260° C.

Similarly, the reason that the content of the amorphous polyetherimide resin is restricted to within a range from 30 to 75% by weight is because if the content is less than 30% by weight, then the crystallinity becomes very high, making lamination more difficult when producing a multilayer structure, whereas if the content exceeds 75% by weight, then the crystallinity of the overall composition falls, and the reflow heat resistance decreases even if the crystalline melting peak temperature is greater than 260° C.

Inorganic fillers can also be added to a thermoplastic resin composition such as that described above.

There are no particular restrictions on the type of inorganic filler, and any known filler can be used. Specific examples of such inorganic fillers include talc, mica, glass flakes, boron nitride (BN), calcium carbonate flakes, aluminum hydroxide flakes, silica flakes, and potassium titanate flakes. These fillers may be used singularly, or in combinations of two or more different fillers. Scale-like flakes of inorganic fillers with an average particle diameter of no more than 15 μm and an aspect ratio (particle diameter/thickness) of more than 30 are particularly preferred, as they enable the ratio of the coefficients of linear expansion ratio in the in-plane direction and the thickness direction to be suppressed to a low level, thereby suppressing the occurrence of cracking within the board during thermal shock cycle testing.

The quantity of these types of inorganic fillers added is preferably within a range from 20 to 50 parts by weight per 100 parts by weight of the thermoplastic resin composition. If the quantity exceeds 50 parts by weight, then problems including unsatisfactory dispersion of the inorganic filler develop, and the coefficient of linear expansion is more likely to vary. In contrast, if the quantity of the filler is less than 20 parts by weight, then the difference in the coefficients of linear expansion of the glass stamper used in the thermal molding process and the insulating substrate 11 can cause a contraction in the dimensions of the insulating substrate 11, and the effect of the invention in reducing the coefficient of linear expansion and improving the dimensional stability is diminished, and in addition, internal stress develops during the reflow process as a result of the difference in the coefficient of linear expansion, making the board more susceptible to warping and twisting.

Other resins, and additives other than the inorganic fillers described above may also be added to a thermoplastic resin composition of the present invention, provided such addition does not impair the properties of the composition, and examples of these other additives include stabilizers, ultraviolet light absorbers, light stabilizers, nucleation agents, coloring agents, lubricants and flame retardants.

Each of these additives, including the inorganic fillers, can be added using known methods, such as the methods (a) and (b) described below.

(a) A method in which each of the additives is mixed at a high concentration (for example, a quantity of 10 to 60% by weight) with the polyarylketone resin and/or the amorphous polyetherimide resin to generate a master batch, and this master batch is then mixed with the resins to be used and the concentration adjusted appropriately, before the mixture is finally blended mechanically using a kneader or an extruder.

(b) A method in which each of the additives is added directly to the resins to be used, and then blended mechanically using a kneader or an extruder.

Of these two methods, the method (a) is preferable in terms of dispersibility and workability. In addition, the surface of the insulating substrate 11 may also be subjected to appropriate embossing or corona treatment or the like, in order to improve handling.

Furthermore, the aforementioned conductive material 15 is produced by heating and curing a conductive paste, and examples of suitable conductive pastes include resin based low temperature curing pastes such as silver (Ag) paste, silver (Ag)-palladium (Pd) paste, and copper (Cu) paste.

Next is a description of a method of manufacturing a multilayer wiring board of this embodiment, based on FIGS. 2A-2D through FIGS. 6A-6B.

First is a description of a method of manufacturing the outermost layer substrates (the uppermost layer substrate and the lowest layer substrate) and the inner layer substrates, followed by a description of a method of manufacturing a multilayer wiring board using these outermost layer substrates and inner layer substrates.

(1) Method of Manufacturing an Outermost Layer Substrate

Figure 2A:
FIGS. 2A to 2D are process diagrams showing a method of manufacturing a multilayer wiring board of the first embodiment of the present invention.

First, as shown in FIG. 2A, an insulating substrate 21 formed from a thermoplastic resin composition comprising a polyarylketone resin with a crystalline melting peak temperature of at least 260° C. and an amorphous polyetherimide resin as the primary constituents is prepared.

This insulating substrate 21 is provided as a film, a thin plate or a sheet. Examples of suitable methods for molding the substrate include conventionally known methods such as extrusion casting methods using a T die, or calender methods, and although there are no particular restrictions on the method employed, extrusion casting methods using a T die are preferred from the viewpoints of sheet film formation and production stability. The molding temperature in such a casting method using a T die can be suitably adjusted in accordance with the fluidity and the film formation properties of the composition, although generally, the temperature should be greater than the crystalline melting peak temperature of the polyarylketone resin (260° C.), but no more than 430° C.

Figure 2B:

Next, as shown in FIG. 2B, a laser or a mechanical drill or the like is used to open through holes 22 in predetermined positions within the insulating substrate 21, which then function as via holes 13.

Figure 2C:
Figure 2D:
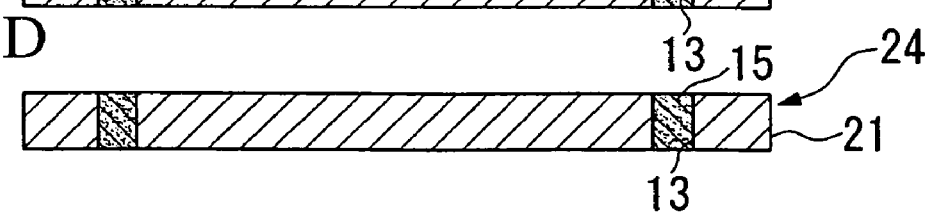

Next, as shown in FIG. 2C, the via holes 13 are filled with a conductive paste 23 using a squeegee printing technique or the like. Subsequently, this conductive paste 23 is heated for 30 to 60 minutes at a temperature of 120 to 160° C., thereby forming a conductive material 15.

Subsequently, any residual conductive material 15 left on the surface of the insulating substrate 21 is ground off and removed using a technique such as mechanical polishing, yielding a wiring substrate 24 with the via holes 13 filled with a conductive material 15 formed by curing a conductive paste, and with the surface of the insulating substrate 21 smoothed to a predetermined surface roughness.

Figure 3A:
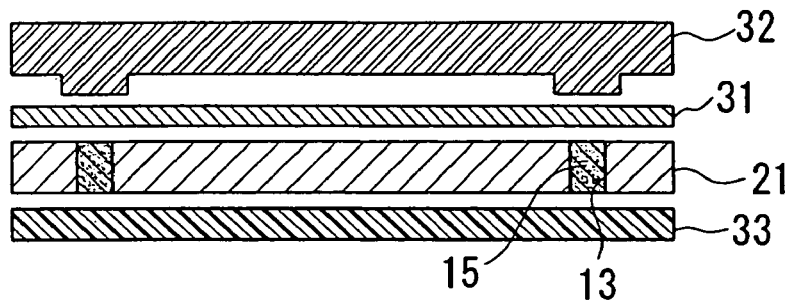
FIGS. 3A to 3E are process diagrams showing a method of manufacturing a multilayer wiring board of the first embodiment of the present invention.
Figure 3B:
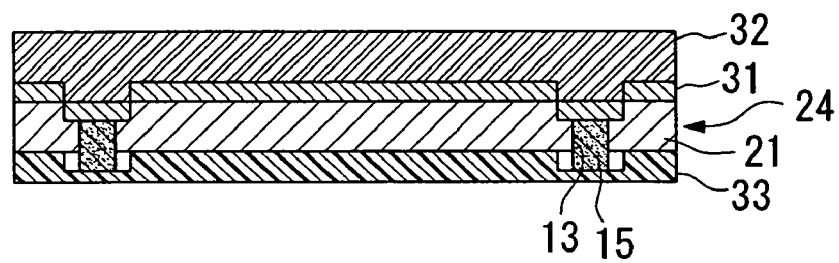

Next, as shown in FIG. 3A, an impressing jig 32 with texture formed on one of the principal surfaces is positioned on top (on one surface) of the insulating substrate 21 with a metallic foil 31 disposed therebetween, while an elastic film 33 which displays a lower modulus of elasticity than the insulating substrate 21 at temperatures lower than the glass transition temperature (Tg1) of the insulating substrate 21 is positioned on the lower surface (the other surface) of the insulating substrate 21. Subsequently, as shown in FIG. 3B, the impressing jig 32 is pressed against the insulating substrate 21, and thermal molding is performed at a temperature greater than the glass transition temperature (Tg2) of the elastic film 33 but lower than the crystallization start temperature (Tcs) of the insulating substrate 21.

Here, the glass transition temperature (Tg1) and the crystallization start temperature (Tcs) of the insulating substrate 21, and the glass transition temperature (Tg2) of the elastic film 33 can be measured using differential scanning calorimetry (DSC). These temperatures can be determined from the DSC profile obtained by heating a measurement sample at a heating rate of 10° C./minute, for example.

For example, in the case of an insulating substrate comprising 40% by weight of a polyarylketone resin with a crystalline melting peak temperature of at least 260° C., and 60% by weight of an amorphous polyetherimide resin, the glass transition temperature (Tg1) is 185° C. and the crystallization start temperature (Tcs) is 225° C.

Furthermore, provided the elastic film 33 displays a lower modulus of elasticity than the insulating substrate 21 at temperatures lower than the glass transition temperature (Tg1) of the insulating substrate 21, then any film is acceptable, and an elastic film formed from a syndiotactic polystyrene is an ideal example. The glass transition temperature (Tg2) of this elastic film 33 is 100° C.

Figure 4:
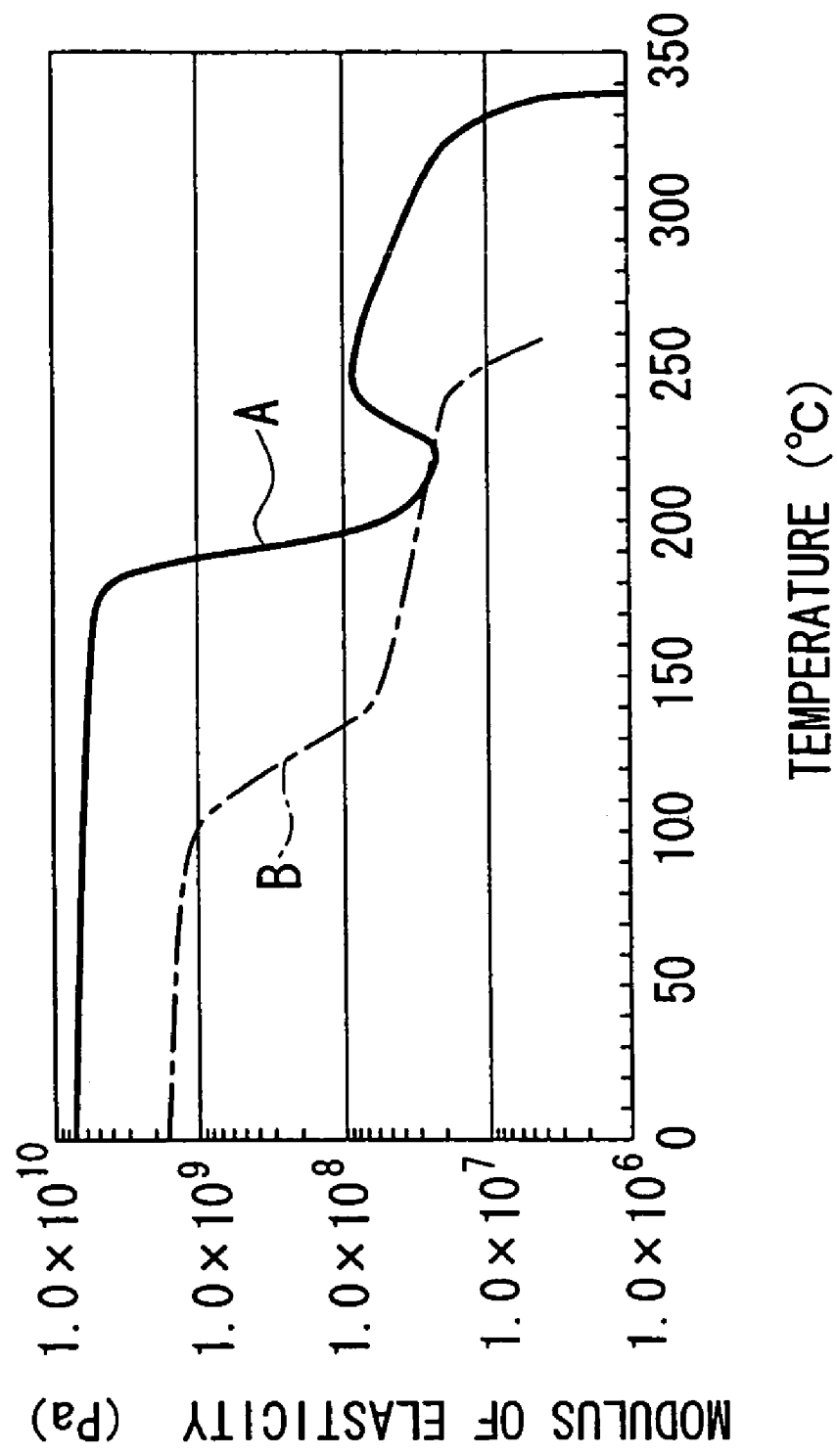
FIG. 4 is a graph showing the temperature dependency of the modulus of elasticity of an insulating substrate and an elastic film.

FIG. 4 is a graph showing the temperature dependency of the modulus of elasticity of the insulating substrate 21 and the elastic film 33. In the figure, A represents the curve for an insulating substrate comprising 40% by weight of a polyarylketone resin with a crystalline melting peak temperature of at least 260° C., and 60% by weight of an amorphous polyetherimide resin, and B represents the curve for an elastic film formed from a syndiotactic polystyrene.

As shown in FIG. 4, the elastic film 33 undergoes softening prior to the softening of the insulating substrate 21, and as a result, the insulating substrate 21 flexes, but plastic deformation does not occur, and consequently the metallic foil 31 is able to cut efficiently.

The temperature of thermal molding is preferably greater than the glass transition temperature (Tg2) of the elastic film 33, and lower than the crystallization start temperature (Tcs) of the insulating substrate 21, and even more preferably, should be lower than the glass transition temperature (Tg1) of the insulating substrate 21.

Figure 3C:
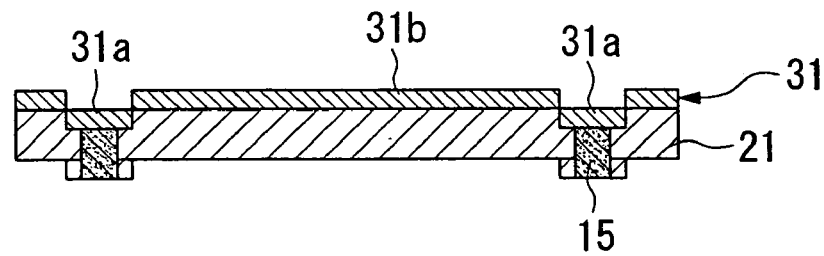

As a result of thermal molding, a pattern is stamped into the metallic foil 31, as shown in FIG. 3C, due to the difference in the modulus of elasticity between the elastic film 33 and the insulating substrate 21, and a difference in fusion strength develops which corresponds with the differing pressure applied by the texture of the impressing jig 32. For example, the metallic foil 31a embedded within the insulating substrate 21 has a high fusion strength and is bonded strongly to the insulating substrate 21, whereas the remaining sections of the metallic foil 31b have only very weak fusion strength, and can be easily stripped away from the insulating substrate 21.

Figure 3D:
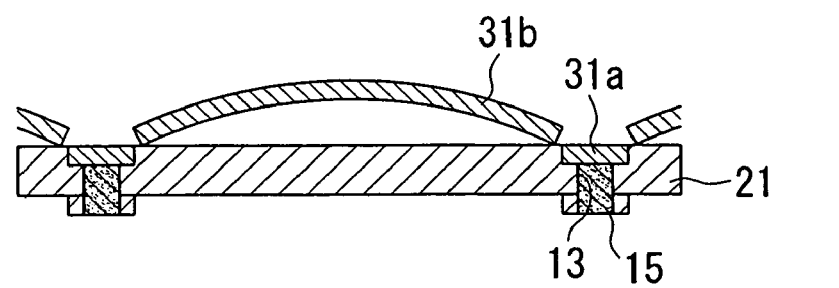

Consequently, as shown in FIG. 3D, the unnecessary metallic foil 31b can be easily stripped off the insulating substrate 21 and removed.

The conductive material 15 formed by curing a conductive paste and a via hole 13 need not necessarily exist beneath the metallic foil 31, although by ensuring that the conductive material 15 is present beneath the entire metallic foil 31, the difference in fusion strength is magnified, and the unnecessary metallic foil 31b can be removed even more easily. Furthermore, there are no particular restrictions on the type or the thickness of the metallic foil 31, although the thickness of the metallic foil 31 is preferably less than the thickness provided by the height difference of the texture of the impressing jig 32. For example, in the case of a height difference of the texture of the impressing jig 32 of 50 μm, a surface roughened conductive copper foil (metallic foil) with a thickness of 9 to 35 μm was used, although even with other thickness values, stripping of the unnecessary conductive copper foil was still possible.

Figure 3E:
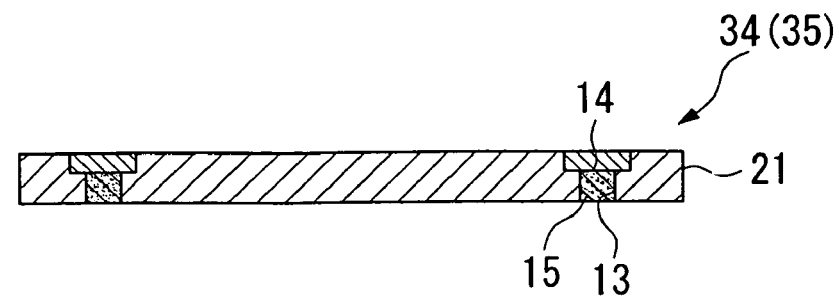

Following removal of the unnecessary metallic foil 31b from the insulating substrate 21, as shown in FIG. 3E, both surfaces of the insulating substrate 21 including the metallic foil 31a and the conductive material 15 are subjected to thermal molding using a molding die not shown in the figure, at a pressure of 0.5 to 10 kg/cm² and at a temperature lower than the crystallization start temperature (Tcs) of the insulating substrate 21, thereby smoothing and flattening both surfaces of the insulating substrate 21 including the metallic foil 31a and the conductive material 15.

Using the steps described above, the metallic foil 14 can be embedded in an outermost layer substrate, namely the substrate 21, with the surface of the foil protruding to the surface of the insulating substrate, and an uppermost layer substrate 34 (or a lowest layer substrate 35) with the via holes 13 filled with the conductive material 15 can be produced.

(2) Method of Manufacturing an Inner Layer Substrate

Figure 5A:
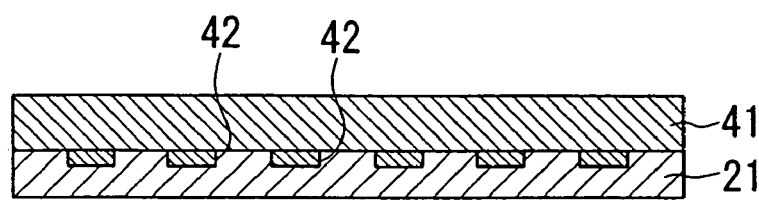
FIGS. 5A to 5F are process diagrams showing a method of manufacturing a multilayer wiring board of the first embodiment of the present invention.

First, as is shown in FIG. 5A, convex sections 42 of a stamper 41 are thermally transferred to a surface (one surface) of an insulating substrate 21 formed from an identical thermoplastic resin composition to that used for the outermost layer substrates described above. The conditions for this thermal transfer include, for example, a temperature of 175 to 205° C. and a pressure of 20 to 60 kg/cm².

Figure 5B:

This thermal transfer forms wiring circuit formation grooves 43 in the surface of the insulating substrate 21, as shown in FIG. 5B.

The stamper 41 is constructed from a material with good releasability relative to the insulating substrate 21 such as glass or ceramic. Heat resistant glass of thickness 3 to 5 mm is particularly suitable. The stamper 41 is produced by forming a resist mask on the surface of a heat resistant glass plate using photolithography techniques, and subsequently forming the convex sections 42 which correspond with the wiring circuit pattern using sand blasting techniques or the like.

Figure 5C:

Next, as shown in FIG. 5C, a laser or a mechanical drill or the like is used to open through holes 44 in predetermined positions within the insulating substrate 21, which then function as via holes 13. These via holes 13 may also be formed by the stamper 41, at the same time as the formation of the wiring circuit formation grooves 43.

Figure 5D:
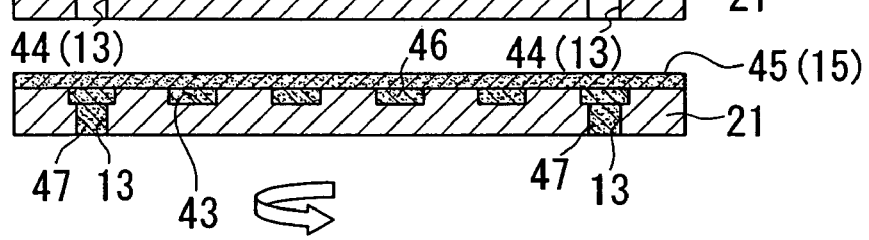

Next, as shown in FIG. 5D, the wiring circuit formation grooves 43 and the via holes 13 are filled with a conductive paste 45 using a squeegee printing technique or the like. Subsequently, this conductive paste 45 is heated for 30 to 60 minutes at a temperature of 120 to 160° C., thereby forming a conductive material 15. This process enables the formation of a conductive circuit 46 and interlayer continuity sections 47 at predetermined positions on the insulating substrate 21.

Figure 5E:
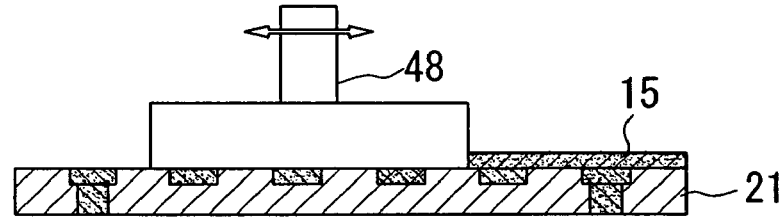
Figure 5F:
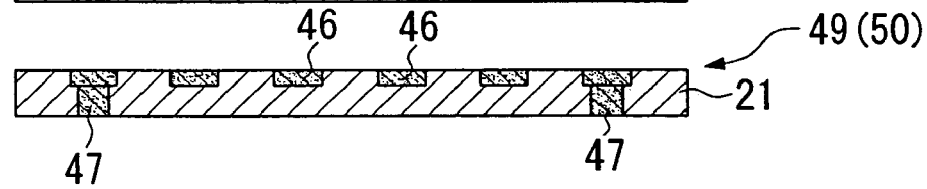

Subsequently, as shown in FIG. 5E, a sanding device 48 is used to grind off and remove any residual conductive material 15 left on the surface of the insulating substrate 21, and smooth the surface of the insulating substrate 21, yielding an inner layer substrate 49 (or an inner layer substrate 50) with a conductive circuit 46 and interlayer continuity sections 47 formed at predetermined positions on the insulating substrate 21.

(3) Method of Manufacturing a Multilayer Wiring Board

Figure 6A:
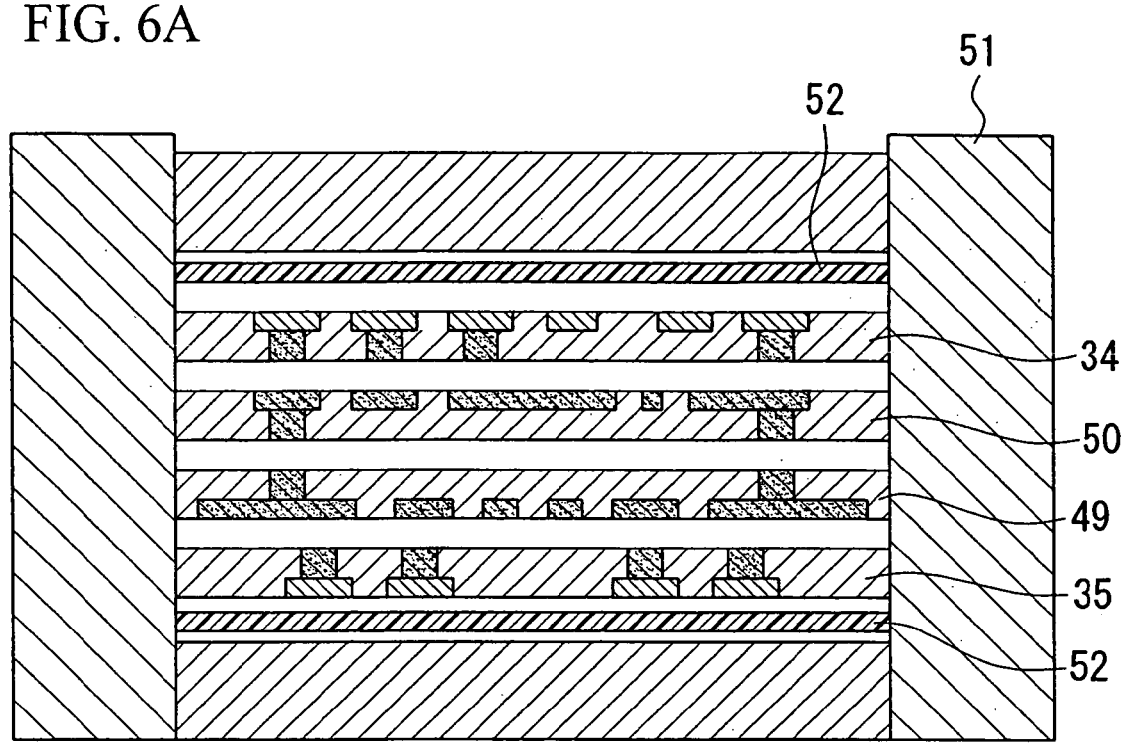
FIGS. 6A and 6B are process diagrams showing a method of manufacturing a multilayer wiring board of the first embodiment of the present invention.
Figure 6B:
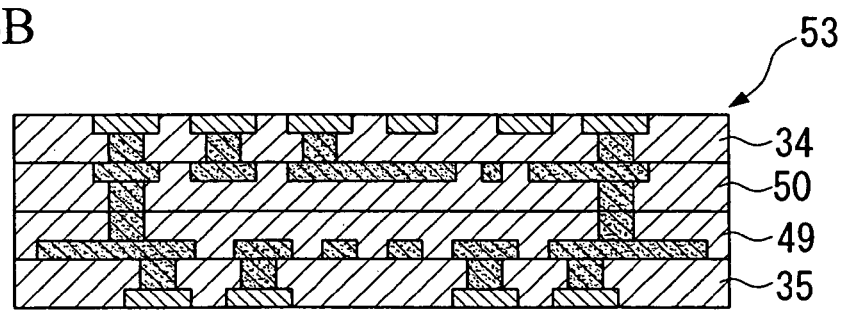

First, as shown in FIG. 6A, a cushion film 52 with good elasticity and releasability, a lowest layer substrate 35, an inner layer substrate 49, an inner layer substrate 50, an uppermost layer substrate 34, and another cushion film 52 with good elasticity and releasability are overlaid, in the above sequence, within a lamination jig 51. Subsequently, the layers from the lowest layer substrate 35 through to the uppermost layer substrate 34 are bonded together and integrated into a single unit by thermal fusion under conditions including a temperature of 200 to 260° C. and a pressure of 20 to 60 kg/cm².

Using the above process, a multilayer wiring board 53 can be produced comprising the lowest layer substrate 35, the inner layer substrate 49, the inner layer substrate 50 and the uppermost layer substrate 34 which have been bonded together and then integrated into a single unit by thermal fusion.

According to the present embodiment, the grooves 12 for forming a wiring circuit are formed in the insulating substrate 11 formed from a thermoplastic resin composition comprising a polyarylketone resin with a crystalline melting peak temperature of at least 260° C. and an amorphous polyetherimide resin as the primary constituents, the via holes 13 which pass through the insulating substrate 11 are formed, the metallic foil 14 is embedded within the grooves 12 so that the surface of the foil protrudes to the surface of the insulating substrate, and the conductive material 15 formed by curing a conductive paste is used to fill the via holes 13, thereby generating a wiring substrate, and consequently a multilayer wiring board with excellent heat resistance, a high degree of mechanical strength and excellent electrical insulation, which is capable of low temperature fusion without the occurrence of resin flow, enables the problems resulting from resin flow such as wiring distortion to be resolved, and enables high precision, finely detailed conductive wiring can be produced. As a result, a multilayer wiring board with excellent electrical characteristics and reliability can be provided.

Furthermore, by appropriate selection of both the thermoplastic resin composition and the type and shape of the conductive wiring, a variety of different wiring substrates can be formed, and as a result, by combining wiring substrates with different specifications, the present invention can be applied to multilayer wiring boards with a wide variety of specifications.

In addition, the combination of a variety of wiring substrates of different specifications makes the invention ideally suited to low volume high mix type manufacturing configurations. Furthermore, by using a conductive paste for the electrical connections, wiring formation using wet processes becomes unnecessary, meaning the environmental impact can be reduced.

Second Embodiment

Figure 7:
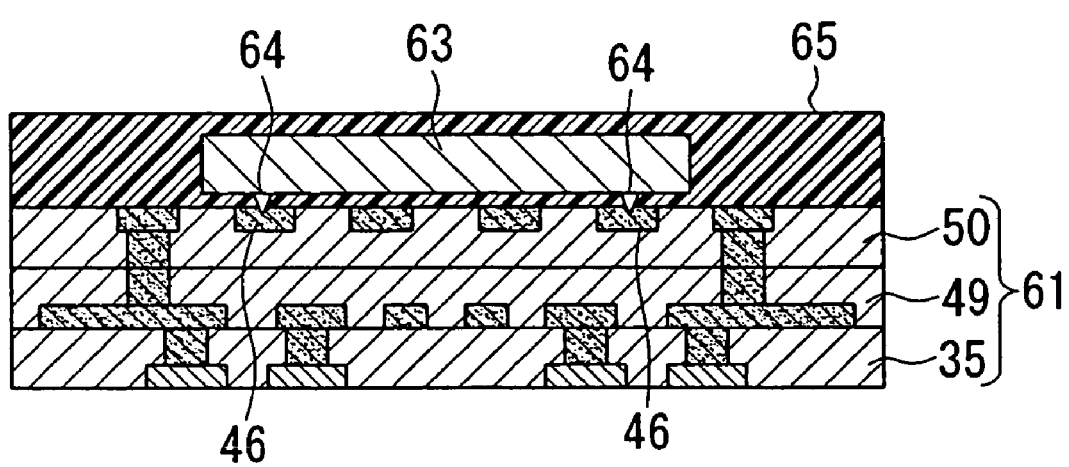
FIG. 7 is a cross-sectional diagram showing an IC package board of a second embodiment of the present invention.

FIG. 7 is a cross-sectional diagram showing an IC package board (a semiconductor device mounting board) of a second embodiment of the present invention.

This IC package board is a multilayer interposer board 61 comprising a lowest layer substrate 35, an inner layer substrate 49 and an inner layer substrate 50 laminated together in this sequence and integrated into a single unit by thermal fusion, and an IC chip (semiconductor device) 63 is fixed directly to the top of the inner layer substrate 50 which functions as an IC chip (semiconductor device) mounting section, so that the pins (terminals) 64 of the IC chip 63 and the conductive circuit 46 are electrically connected, and the IC chip 63 is then sealed with a sealing resin 65 such as an epoxy resin.

Figure 8A:
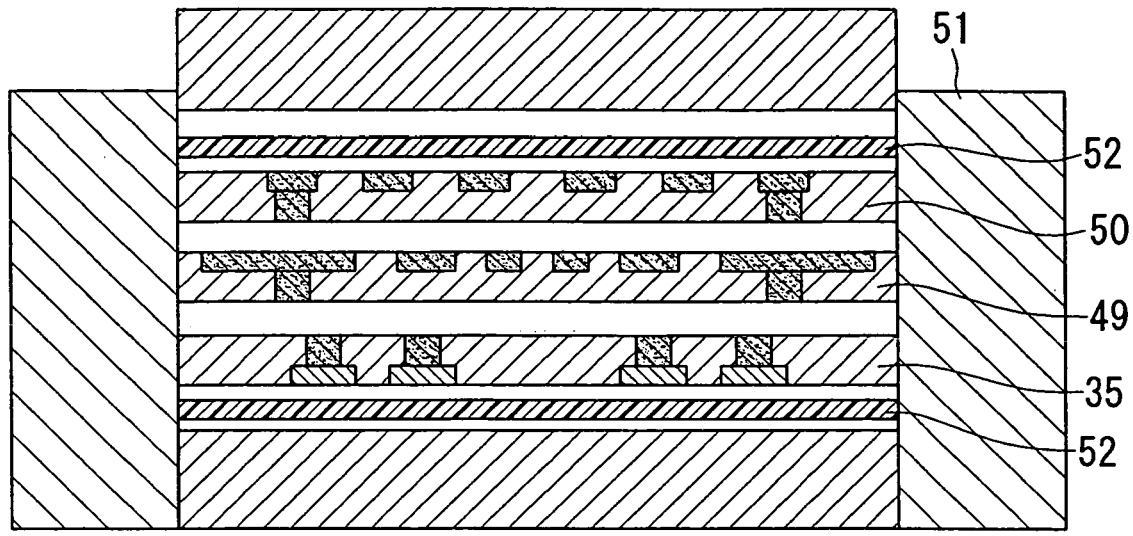
FIGS. 8A and 8C are process diagrams showing a method of manufacturing an IC package board of the second embodiment of the present invention.

In order to manufacture this IC package board, first, as shown in FIG. 8A, a cushion film 52 with good elasticity and releasability, a lowest layer substrate 35, an inner layer substrate 49, an inner layer substrate 50, and another cushion film 52 with good elasticity and releasability are overlaid, in the above sequence within a lamination jig 51. Subsequently, the layers from the lowest layer substrate 35 through to the inner layer substrate 50 are bonded together and integrated into a single unit by thermal fusion under conditions including a temperature of 200 to 260° C. and a pressure of 20 to 60 kg/cm², thereby forming the multilayer interposer board 61.

Figure 8B:
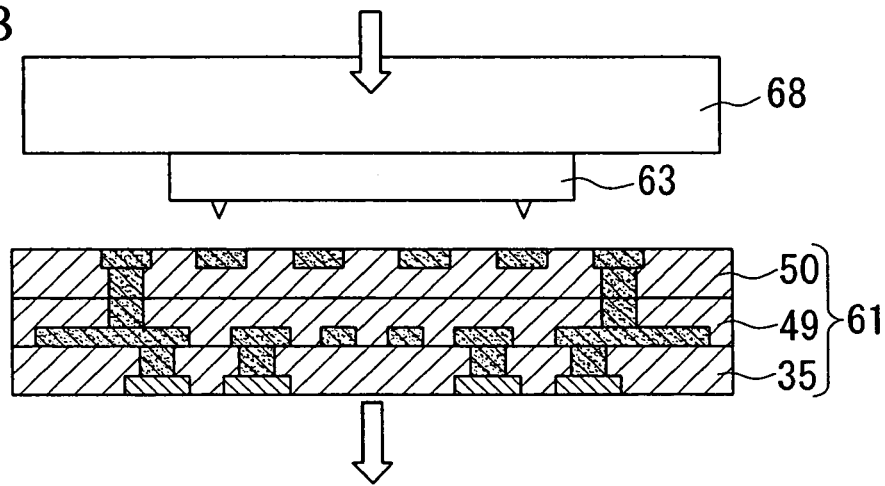
Figure 8C:
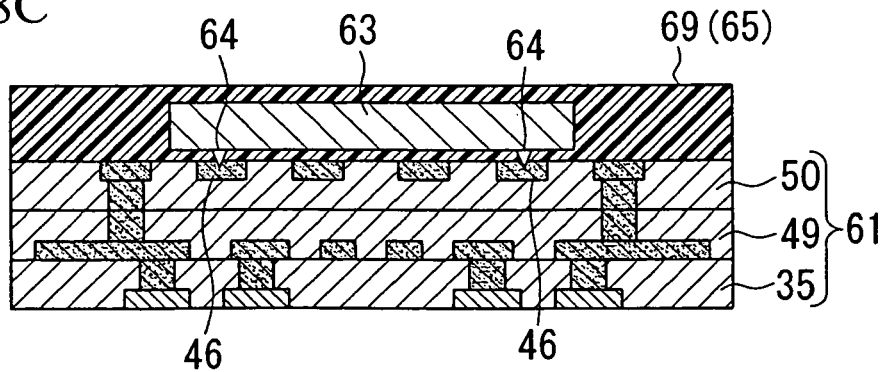

Next, as shown in FIG. 8B, the IC chip 63 is mounted on top of the inner layer substrate 50 which functions as an IC chip mounting section, and this IC chip 63 is then subjected to thermocompression bonding using a hot plate 68 at a predetermined temperature, such as a temperature within a range from 175 to 205° C., which is lower than the crystallization start temperature of the insulating substrate. As shown in FIG. 8C, the pins 64 of the IC chip 63 are connected electrically with the conductive circuit 46.

Next, a sealing resin agent 69 such as an epoxy resin is applied so as to cover the IC chip 63, and this sealing resin agent 69 is then heated and cured, thereby forming the sealing resin 65.

In this manner, by keeping the temperature during the mounting of the IC chip 63 to a temperature of 175 to 205° C., lower than the crystallization start temperature of the insulating substrate, subsequent low temperature lamination becomes possible. Furthermore, a rapid heat curing type epoxy resin could also be supplied to the top of the inner layer substrate 50 and then bonded by thermocompression bonding.

This second embodiment provides the same effects as those described for a multilayer wiring board of the first embodiment.

Moreover, because an IC chip 63 is fixed directly onto the inner layer substrate 50 which functions as an IC chip mounting section, a high precision, finely detailed, and high density IC package board can be produced.

Third Embodiment

Figure 9:
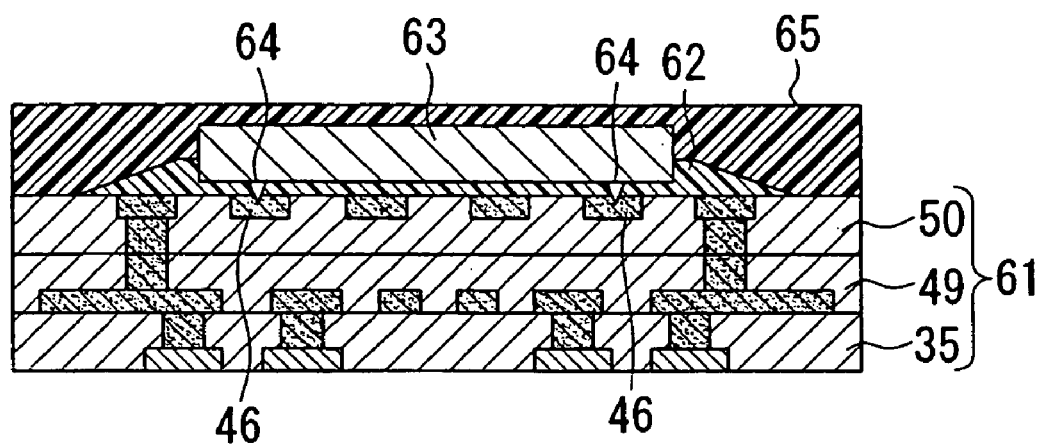
FIG. 9 is a cross-sectional diagram showing an IC package board of a third embodiment of the present invention.

FIG. 9 is a cross-sectional diagram showing an IC package board (a semiconductor device mounting board) of a third embodiment of the present invention.

This IC package board differs from the IC package board of the second embodiment in that whereas in the IC package board of the second embodiment, the IC chip 63 was fixed directly onto the inner layer substrate 50 which functions as the IC chip mounting section, in the IC package board of this embodiment, the IC chip 63 is fixed to the top of the inner layer substrate 50, which functions as the IC chip mounting section, via an IC chip fixing adhesive 62.

Figure 10A:
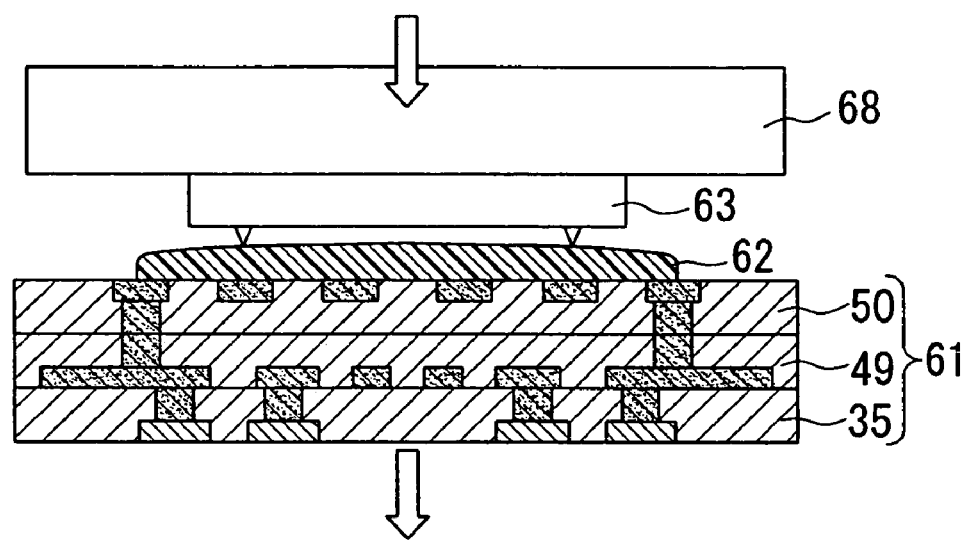
FIGS. 10A and 10B are process diagrams showing a method of manufacturing an IC package board of the third embodiment of the present invention.
Figure 10B:
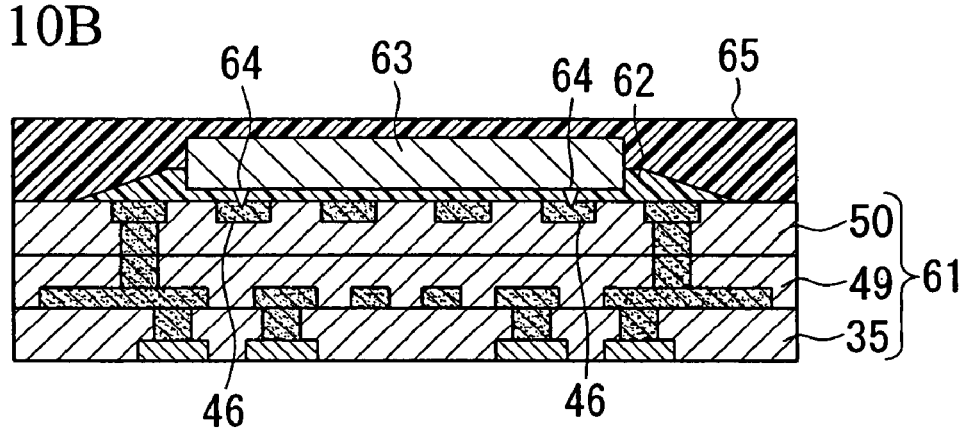

In order to manufacture this IC package board, a multilayer interposer board 61 is first prepared in the same manner as described for the IC package board of the second embodiment, and then, as shown in FIG. 10A, the IC chip fixing adhesive 62 is applied to the top of the inner layer substrate 50 which functions as the IC chip mounting section, an IC chip 63 is mounted to a fixed position on this IC chip fixing adhesive 62, and the IC chip 63 is then subjected to thermocompression bonding using a hot plate 68 at a predetermined temperature, such as a temperature within a range from 175 to 205° C., which is lower than the crystallization start temperature of the insulating substrate. As shown in FIG. 10B, the pins 64 of the IC chip 63 are connected electrically with the conductive circuit 46.

Next, a sealing resin agent 69 such as an epoxy resin is applied so as to cover the IC chip 63 and the IC chip fixing adhesive 62, and this sealing resin agent 69 is then heated and cured, thereby forming a sealing resin 65.

This third embodiment provides the same effects as those described for a multilayer wiring board of the first embodiment.

Moreover, because the IC chip 63 is fixed to the inner layer substrate 50, which functions as an IC chip mounting section, via the IC chip fixing adhesive 62, good insulation can be ensured by the IC chip fixing adhesive 62 even in those cases in which the insulation between the inner layer substrate 50 and the chip 63 is not totally reliable, and consequently a high precision, finely detailed, and high density IC package board can be produced.

What is claimed is:

1. A method of manufacturing a multilayer wiring board comprising the steps of:

performing thermal molding on either one surface or both surfaces of an insulating substrate formed from a thermoplastic resin composition comprising a polyarylketone resin with a crystalline melting peak temperature of at least 260° C. and an amorphous polyetherimide resin as primary constituents, at a temperature which is higher than a glass transition temperature but lower than a crystallization start temperature of said thermoplastic resin composition, thereby forming a conductive region comprising a combination of grooves for forming a wiring circuit and via holes on said one surface or both surfaces, subsequently filling said conductive region with a conductive paste and forming a wiring circuit in which said conductive paste functions as conductive wiring, thereby forming a wiring substrate comprising said insulating substrate and said wiring circuit, and subsequently laminating a plurality of said wiring substrates together, bonding and crystallizing insulating substrates of said wiring substrates by thermal fusion at a temperature higher than said crystallization start temperature, and electrically connecting said plurality of wiring substrates with said conductive paste.

2. A method of manufacturing a multilayer wiring board according to claim 1, wherein said insulating substrate is formed from an amorphous film produced by molten mixing and rapid cooling of a thermoplastic resin composition comprising a polyarylketone resin with a crystalline melting peak temperature of at least 260° C. and an amorphous polyetherimide resin as primary constituents.

3. A method of manufacturing a multilayer wiring board comprising the steps of:

performing thermal molding on at least one surface of an insulating substrate comprising a thermoplastic resin composition with a crystalline melting peak temperature of at least 260° C., at a temperature which is higher than a glass transition temperature but lower than a crystallization start temperature of said thermoplastic resin composition, thereby forming a conductive region comprising a combination of grooves for forming a wiring circuit and via holes on said at least one surface, subsequently filling said conductive region with a conductive paste and forming a wiring circuit, thereby forming a wiring substrate comprising said insulating substrate and said wiring circuit, and subsequently laminating a plurality of said wiring substrates together, bonding and crystallizing insulating substrates of said wiring substrates by thermal fusion at a temperature higher than said crystallization start temperature, and electrically connecting said plurality of wiring substrates with said conductive paste.

* * * * *

UNITED STATES PATENT AND TRADEMARK OFFICE
CERTIFICATE OF CORRECTION

PATENT NO. : 7,334,324 B2  Page 1 of 1
APPLICATION NO. : 10/925644
DATED : February 26, 2008
INVENTOR(S) : Minoru Ogawa et al.

It is certified that error appears in the above-identified patent and that said Letters Patent is hereby corrected as shown below:

Title Page,

Item (56) References Cited,

FOREIGN PATENT DOCUMENTS

Insert -- JP          S49-127166          12/1974 --.

Insert -- JP          H8-151492           6/1996 --.

Signed and Sealed this

Second Day of February, 2010

David J. Kappos
*Director of the United States Patent and Trademark Office*